(12) United States Patent
Liu et al.

(10) Patent No.: US 11,024,738 B2
(45) Date of Patent: Jun. 1, 2021

(54) MEASUREMENT OF TOP CONTACT RESISTANCE IN VERTICAL FIELD-EFFECT TRANSISTOR DEVICES

(71) Applicant: International Business Machines Corporation, Armonk, NY (US)

(72) Inventors: Zuoguang Liu, Schenectady, NY (US); Richard Glen Southwick, III, Halfmoon, NY (US); Xin Miao, Slingerlands, NY (US); Chun Wing Yeung, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 16/352,328

(22) Filed: Mar. 13, 2019

(65) Prior Publication Data
US 2020/0295175 A1    Sep. 17, 2020

(51) Int. Cl.
*H01L 29/78*  (2006.01)
*H01L 29/417*  (2006.01)
(Continued)

(52) U.S. Cl.
CPC ............ *H01L 29/785* (2013.01); *G01R 31/26* (2013.01); *H01L 21/823412* (2013.01);
(Continued)

(58) Field of Classification Search
CPC . H01L 29/785; H01L 22/14; H01L 29/41791; H01L 29/66666; H01L 29/7827;
(Continued)

(56) References Cited

U.S. PATENT DOCUMENTS

| 5,760,600 A | * | 6/1998 | Kasai | G01R 31/2621 |
| | | | | 324/762.09 |
| 8,779,794 B2 | * | 7/2014 | Bernoux | H01L 24/05 |
| | | | | 324/762.01 |

(Continued)

FOREIGN PATENT DOCUMENTS

| CN | 106571312 A | 4/2017 |
| JP | 07245401 A | 9/1995 |
| JP | 10-73632 A | 3/1998 |

*Primary Examiner* — Earl N Taylor
(74) *Attorney, Agent, or Firm* — Randall Bluestone; Ryan, Mason & Lewis, LLP

(57) ABSTRACT

Semiconductor device structures and techniques are provided for measuring contact resistance. A semiconductor device is disclosed including a first source/drain region and a contact disposed on the first source/drain region and configured to supply energy to the semiconductor device. A fin extends between the first source/drain region and a second source/drain region of the semiconductor device. A first contact material layer is disposed on the second source/drain region and a first active drain contact is disposed on the first contact material layer. A first sensor drain contact is also disposed on the first contact material layer. A second contact material layer is disposed on the second source/drain region and a second active drain contact is disposed on the second (Continued)

contact material layer. A third contact material layer is disposed on the second source/drain region and a second sensor drain contact is disposed on the third contact material layer.

14 Claims, 12 Drawing Sheets

(51) Int. Cl.
　　*H01L 29/66* (2006.01)
　　*H01L 21/8234* (2006.01)
　　*G01R 31/26* (2020.01)
　　*H01L 21/66* (2006.01)

(52) U.S. Cl.
　　CPC ........ *H01L 22/14* (2013.01); *H01L 29/41791* (2013.01); *H01L 29/66666* (2013.01); *H01L 29/66795* (2013.01); *H01L 29/7827* (2013.01)

(58) Field of Classification Search
　　CPC ....... H01L 21/823412; H01L 29/66795; H01L 22/34; H01L 29/41741; H01L 29/0676; G01R 31/26
　　See application file for complete search history.

(56) References Cited

U.S. PATENT DOCUMENTS

| | | | | |
|---|---|---|---|---|
| 9,431,305 | B1* | 8/2016 | Anderson | H01L 29/78696 |
| 9,627,280 | B2* | 4/2017 | Wann | H01L 22/14 |
| 9,768,085 | B1* | 9/2017 | Cheng | H01L 29/66712 |
| 9,997,421 | B2* | 6/2018 | Cheng | H01L 22/32 |
| 10,002,809 | B2* | 6/2018 | Cheng | G01R 27/205 |
| 10,002,962 | B2* | 6/2018 | Anderson | H01L 29/7827 |
| 10,622,257 | B2* | 4/2020 | Zhang | H01L 21/823487 |
| 2010/0187601 | A1* | 7/2010 | Masuoka | H01L 29/7827 257/329 |
| 2017/0307667 | A1* | 10/2017 | Liu | G01R 27/205 |
| 2018/0006024 | A1* | 1/2018 | Anderson | H01L 29/66666 |
| 2018/0025950 | A1* | 1/2018 | Cheng | H01L 21/845 438/18 |
| 2018/0025954 | A1* | 1/2018 | Cheng | H01L 29/66795 257/48 |
| 2019/0189520 | A1* | 6/2019 | Zhang | H01L 29/7827 |
| 2020/0035565 | A1* | 1/2020 | Zhang | H01L 21/823487 |
| 2020/0295175 | A1* | 9/2020 | Liu | H01L 22/14 |

* cited by examiner

100

100

MEASUREMENT OF TOP CONTACT RESISTANCE IN VERTICAL FIELD-EFFECT TRANSISTOR DEVICES

BACKGROUND

Continued innovations in semiconductor process technologies are enabling higher integration densities and device scaling. As semiconductor manufacturing technologies continue to evolve toward smaller design rules and higher integration densities (e.g., 14/10/7 nm technology nodes and beyond), integrated circuit devices and components become increasingly smaller, creating challenges in layout formation and device performance optimization. Currently, vertical FET technologies are considered to be viable CMOS scaling solutions for FET fabrication at, and below, the 7 nm technology node. The vertical FET technology decouples gate length from the gate pitch requirement, thereby enabling FET density scaling. In general, vertical FET devices are designed to have gate structures that are formed on multiple sides of a vertical channel structure (e.g., a vertical semiconductor fin or vertical nanowire), and with an upper doped source/drain layer formed at the top of the vertical channel structure and a lower doped source/drain layer formed at the bottom of the vertical channel structure.

Various challenges for fabricating vertical FET devices include, for example, accurately characterizing the resistance of various layers in the vertical FET devices.

SUMMARY

Embodiments of the invention include device structures and techniques for measuring contact resistance in the top contact and upper source/drain region of a vertical FET device. For example, one embodiment includes a method of measuring contact resistance in a semiconductor device comprising supplying energy to a contact connected to a first source/drain region of the semiconductor device. The energy flows through the semiconductor device to at least a first active drain contact and a second active drain contact of the semiconductor device. A first electrical potential associated with the supplied energy is measured using a first sensing device connected to one of a first contact material layer disposed on a second source/drain region of the semiconductor device and a second contact material layer disposed on the second source/drain region. The first active drain contact is disposed on the first contact material layer and the second active drain contact is disposed on the second contact material layer. A first voltage drop between a voltage of the energy flowing to the first active drain contact and the first electrical potential is determined and a second electrical potential associated with the supplied energy is measured using a second sensing device connected to a third contact material layer disposed on the second source/drain region. A second voltage drop between the first electrical potential and the second electrical potential is determined and a difference between the first voltage drop and the second voltage drop is determined. A resistance of the second source/drain layer is determined based on the determined difference between the first voltage drop and the second voltage drop.

Another embodiment includes a semiconductor device comprising a first source/drain region and a contact disposed on the first source/drain region and configured to supply energy to the semiconductor device. A fin extends between the first source/drain region and a second source/drain region of the semiconductor device. A first contact material layer is disposed on the second source/drain region and a first active drain contact is disposed on the first contact material layer. A first sensor drain contact is also disposed on the first contact material layer. A second contact material layer is disposed on the second source/drain region and a second active drain contact is disposed on the second contact material layer. A third contact material layer is disposed on the second source/drain region and a second sensor drain contact is disposed on the third contact material layer.

Another embodiment includes a method for fabricating a semiconductor device comprising forming a vertical field effect transistor device comprising a bottom source/drain region, a plurality of fins, and upper source/drain regions disposed on the plurality of fins. A first contact material layer is formed across the upper source/drain regions disposed on the plurality of fins of the vertical field effect transistor device. A second contact material layer is formed across the upper source/drain regions disposed on the plurality of fins of the vertical field effect transistor device. A third contact material layer is formed across the upper source/drain regions disposed on the plurality of fins of the vertical field effect transistor device. A first active drain contact and a first sensor drain contact are formed on the first contact material layer. A second active drain contact is formed on the second contact material layer and a second sensor drain contact is formed on the third contact material layer.

Other embodiments will be described in the following detailed description of embodiments, which is to be read in conjunction with the accompanying figures.

DETAILED DESCRIPTION

Figure 1:
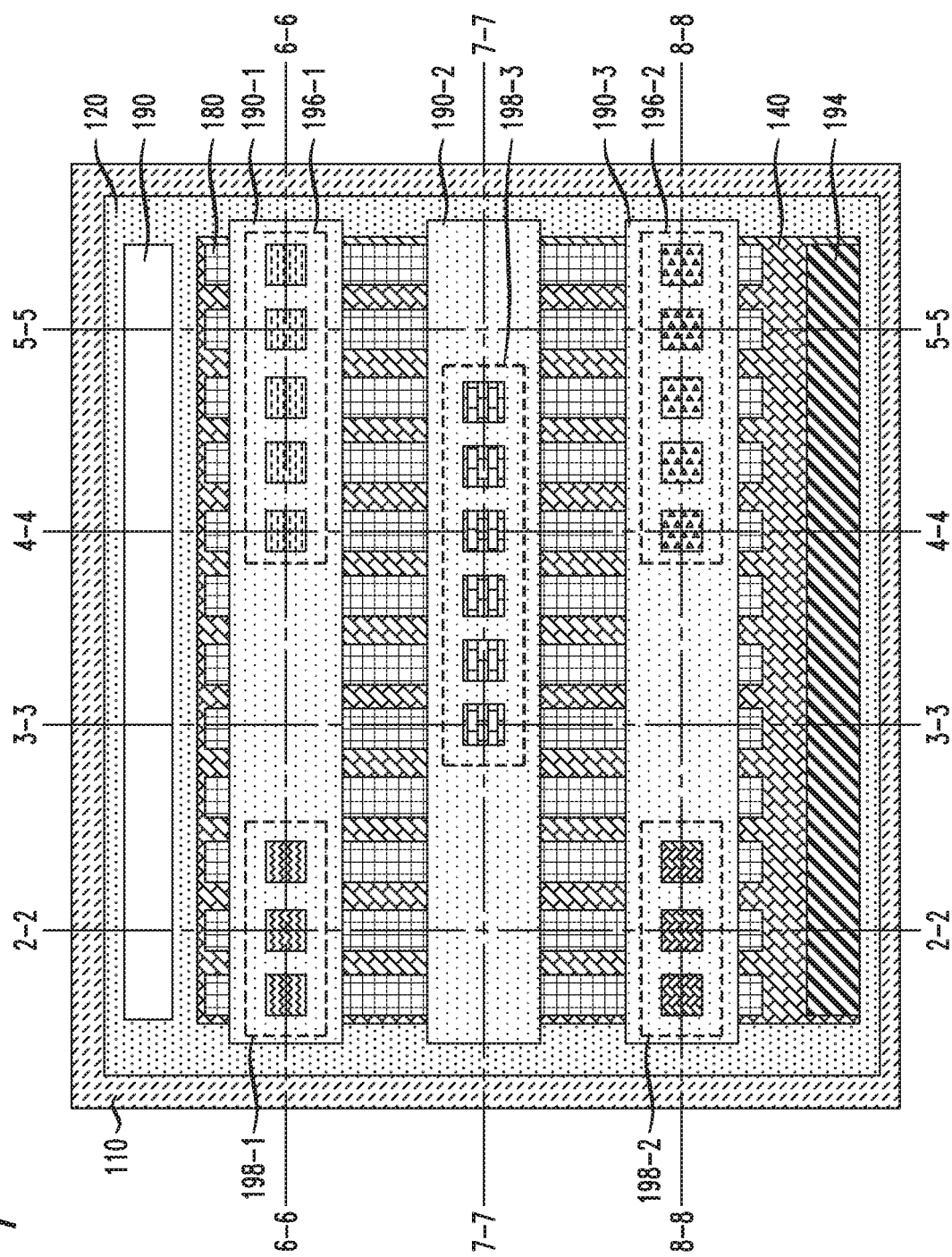
FIG. 1 is a schematic cross-sectional side view of a semiconductor integrated circuit (IC) device, according to an embodiment of the present disclosure.

Embodiments of the invention will now be described in further detail with regard to techniques and device structures for measuring top contact resistance (including upper source/drain resistance) in vertical FET devices. It is to be understood that the various layers, structures, and regions shown in the accompanying drawings are schematic illustrations that are not drawn to scale. In addition, for ease of explanation, one or more layers, structures, and regions of a type commonly used to form semiconductor IC devices or structures may not be explicitly shown in a given drawing. This does not imply that any layers, structures, and regions not explicitly shown are omitted from the actual semiconductor IC device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor IC devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor IC device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 2:
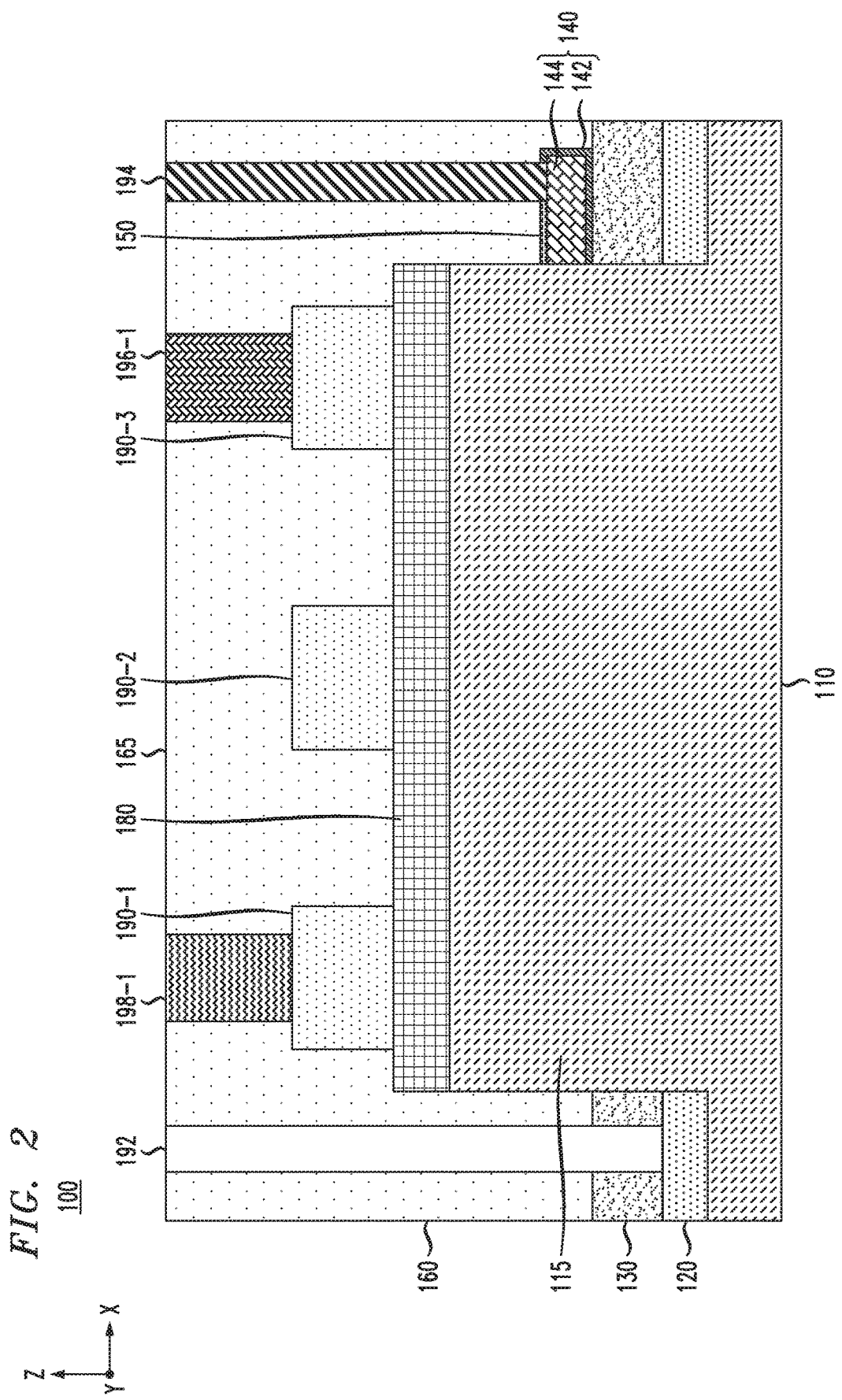
FIG. 2 is a schematic cross-sectional side view of the semiconductor IC device along line 2-2 in FIG. 1.
Figure 3:
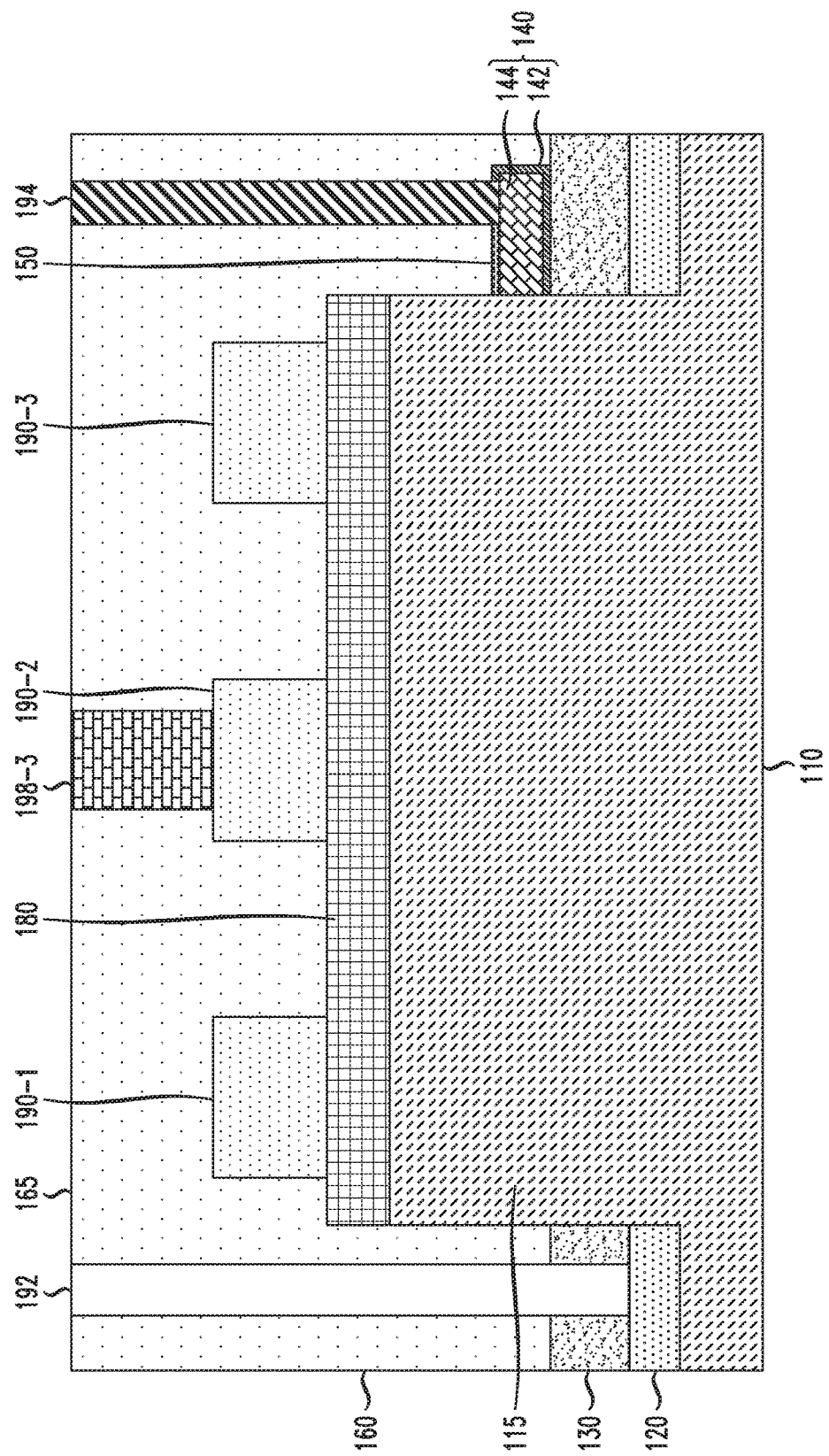
FIG. 3 is a schematic cross-sectional side view of the semiconductor IC device along line 3-3 in FIG. 1.
Figure 4:
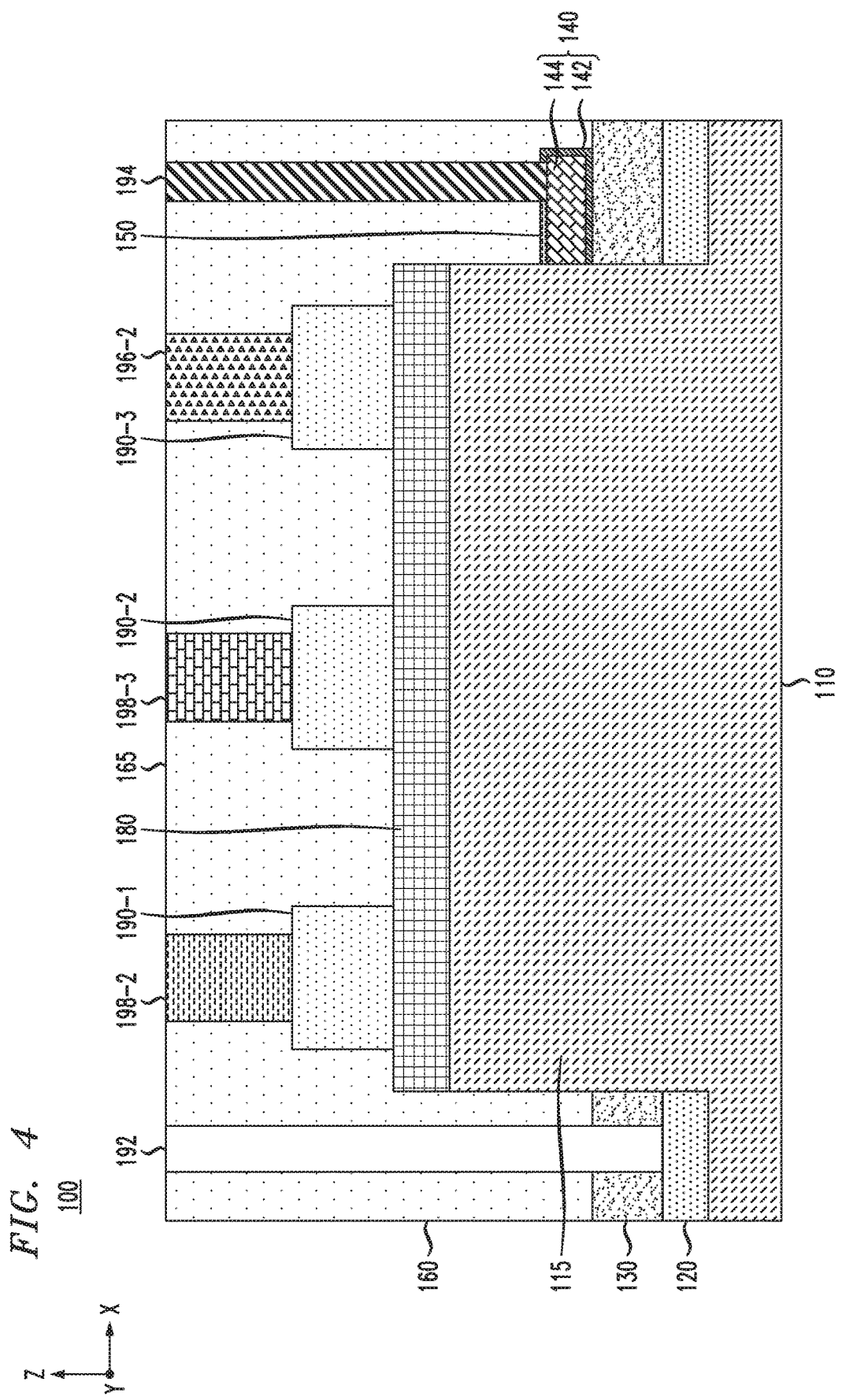
FIG. 4 is a schematic cross-sectional side view of the semiconductor IC device along line 4-4 in FIG. 1.
Figure 5:
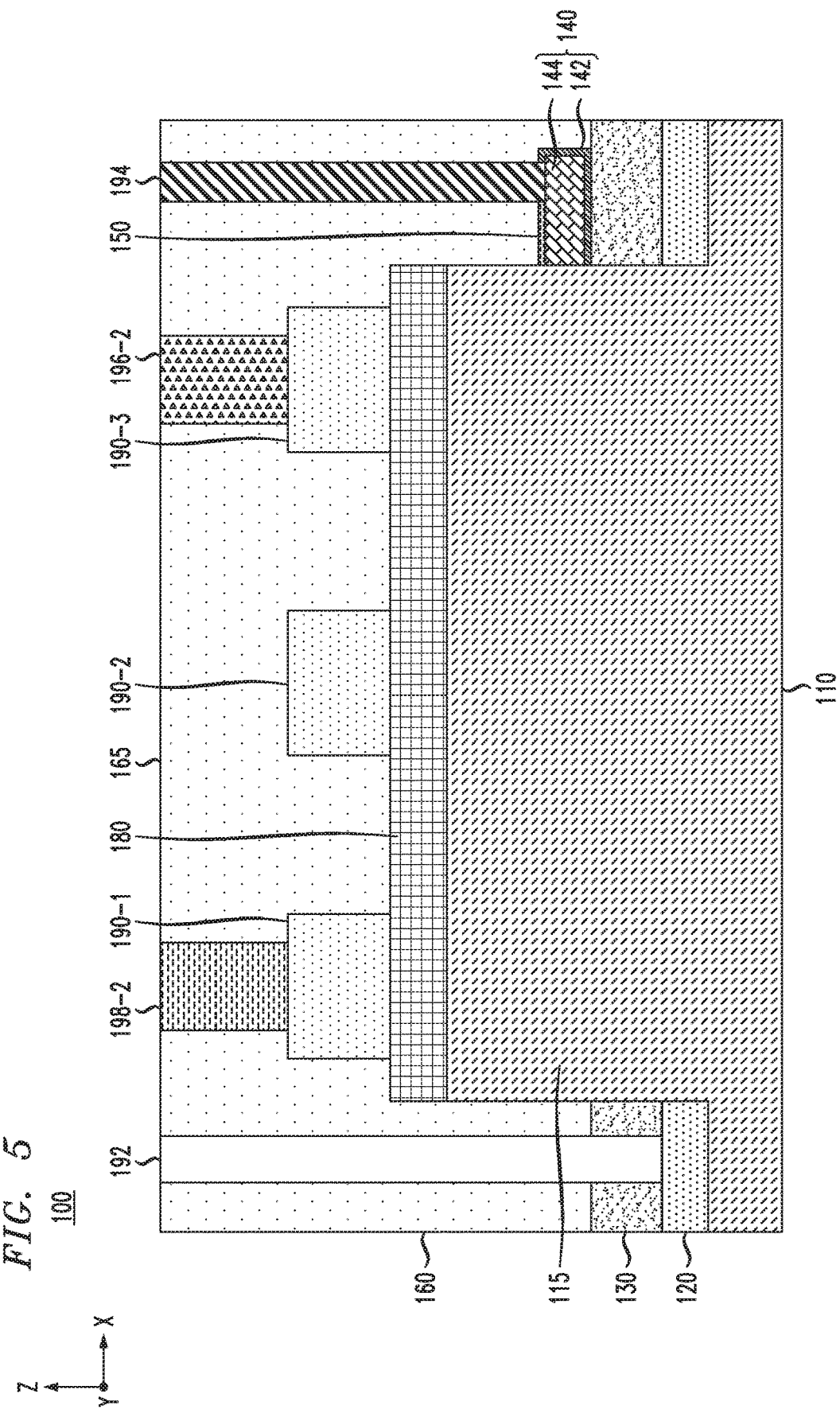
FIG. 5 is a schematic cross-sectional side view of the semiconductor IC device along line 5-5 in FIG. 1.
Figure 6:
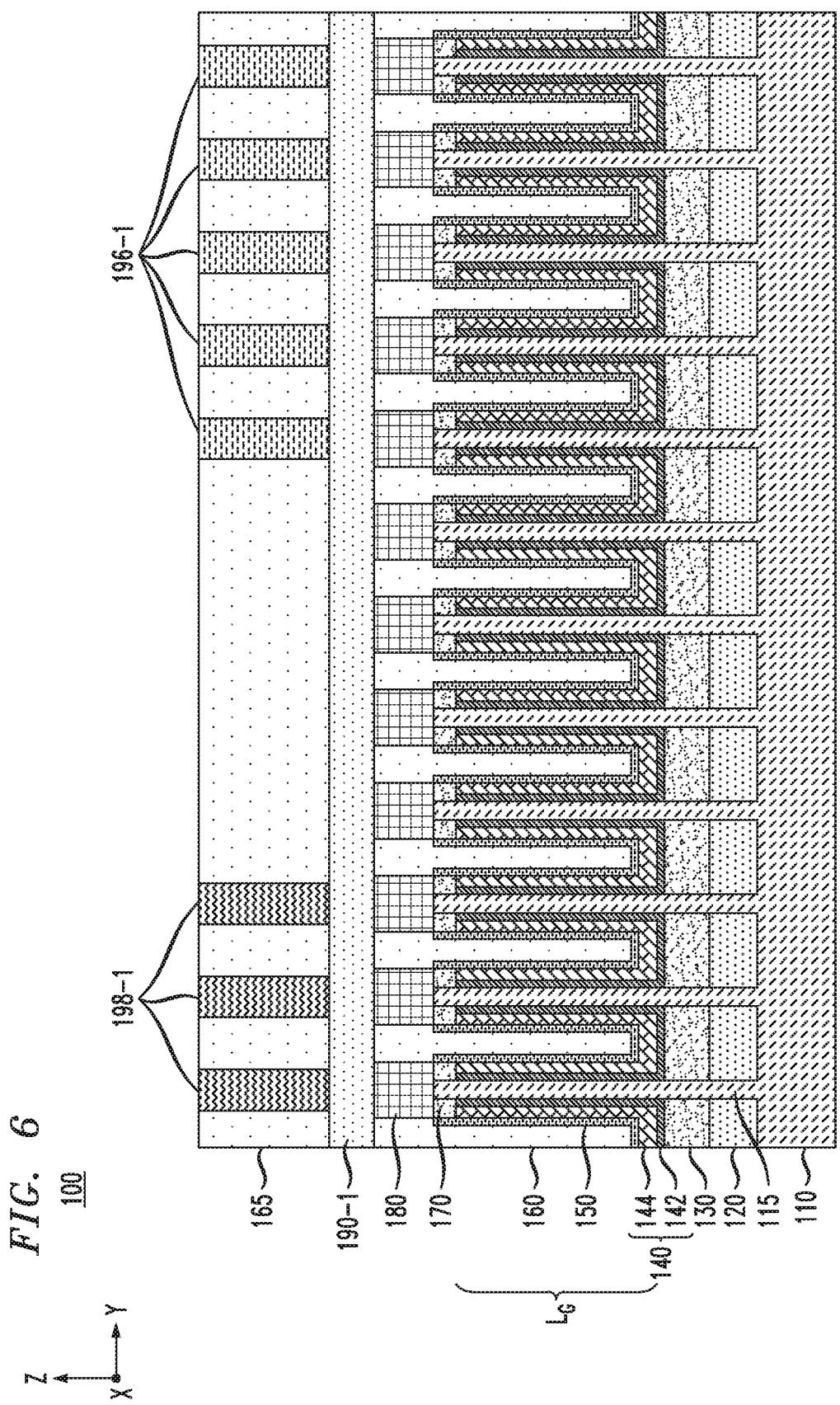
FIG. 6 is a schematic cross-sectional side view of the semiconductor IC device along line 6-6 in FIG. 1.
Figure 7:
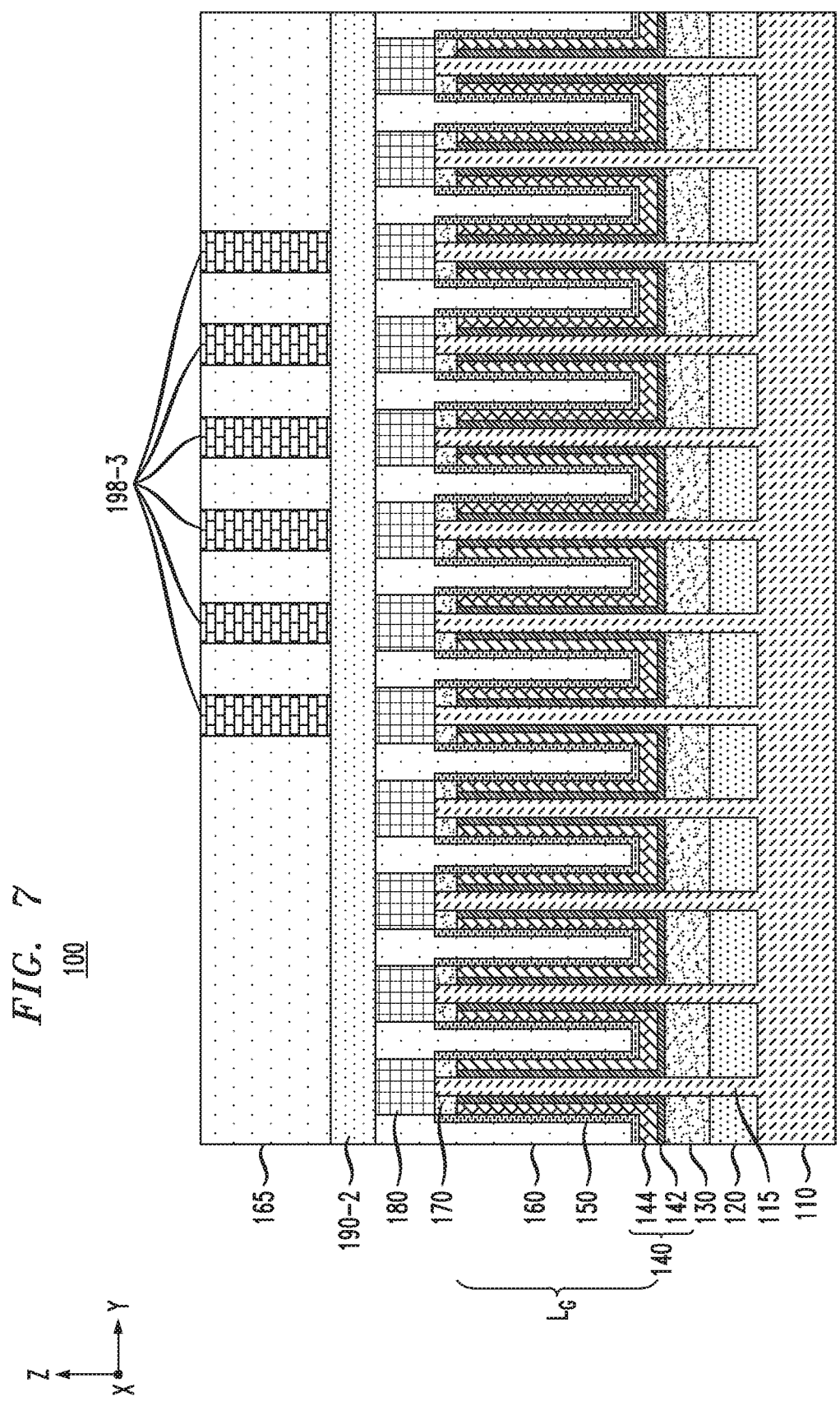
FIG. 7 is a schematic cross-sectional side view of the semiconductor IC device along line 7-7 in FIG. 1.
Figure 8:
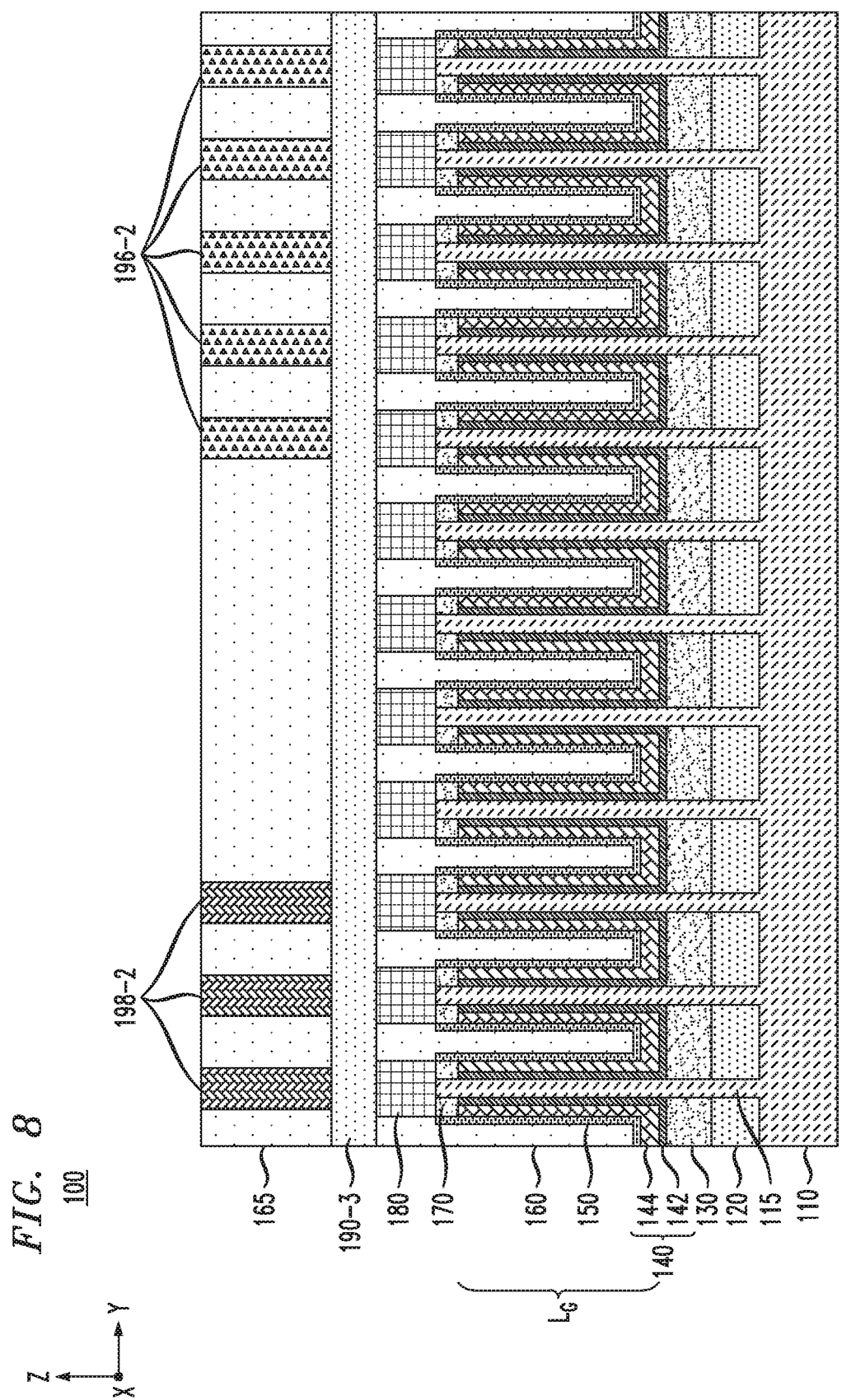
FIG. 8 is a schematic cross-sectional side view of the semiconductor IC device along line 8-8 in FIG. 1.

FIGS. 1-8 are schematic views of a semiconductor integrated circuit (IC) device 100 comprising a vertical FET device, according to according to an embodiment of the invention. FIG. 1 is a schematic top plan view (X-Y plane) of the semiconductor IC device 100, while FIGS. 2-8 are cross-sectional side views of the semiconductor IC device 100 along planes that are represented by respective lines shown in FIG. 1. In particular, FIG. 2 is a schematic cross-sectional side view (X-Z plane) of the semiconductor IC device 100 along line 2-2 in FIG. 1, FIG. 3 is a schematic cross-sectional side view (X-Z plane) of the semiconductor IC device 100 along line 3-3 in FIG. 1, FIG. 4 is a schematic cross-sectional side view (X-Z plane) of the semiconductor IC device 100 along line 4-4 in FIG. 1, FIG. 5 is a schematic cross-sectional side view (X-Z plane) of the semiconductor IC device 100 along line 5-5 in FIG. 1, FIG. 6 is a schematic cross-sectional side view (Y-Z plane) of the semiconductor IC device 100 along line 6-6 in FIG. 1, FIG. 7 is a schematic cross-sectional side view (Y-Z plane) of the semiconductor IC device 100 along line 7-7 in FIG. 1, and FIG. 8 is a schematic cross-sectional side view (Y-Z plane) of the semiconductor IC device 100 along line 8-8 in FIG. 1.

As shown in FIGS. 1-8, the semiconductor IC device 100 comprises a semiconductor substrate 110, a plurality of vertical semiconductor fins 115, a bottom source/drain region 120, a bottom spacer layer 130, a high-k dielectric/metal gate (HKMG) structure 140, a gate encapsulation liner layer 150, a first interlayer dielectric (ILD) layer 160, a second ILD layer 165, top spacers 170, upper epitaxial source/drain layers 180, vertical source/drain contacts 190-1, 190-2, 190-3, and 192, a vertical gate contact 194, active drain contacts 196-1 and 196-2, and sensor drain contacts 198-1, 198-2, and 198-3. The HKMG structure 140 comprises a high-k gate dielectric layer 142 and a metal gate layer 144. It is to be understood that the term "source/drain region" or "source/drain layer" as used herein means that a given source/drain region or source/drain layer can be either a source or drain element of the FET device, depending on the application or circuit configuration. It is to be noted that the schematic top plan view of the semiconductor IC device 100 as shown in FIG. 1 is meant to illustrate a footprint area and layout of the semiconductor substrate 110, the bottom source/drain region 120, the HKMG structure 140, and the vertical contacts 190-1, 190-2, 190-3, 192, and 194, while omitting other elements for ease of illustration.

FIGS. 1-8 schematically illustrate a structure of a multi-fin vertical FET device comprising twelve vertical semiconductor fins 115 which are commonly connected to the bottom source/drain region 120, and have a common HKMG structure 140 which is formed around sidewalls of the vertical semiconductor fins 115. Any other number of vertical semiconductor fins 115 may be used. The length portions of the vertical semiconductor fins 115 which are overlapped by the HKMG structure 140 define a gate length $L_G$ of the vertical FET device. The vertical source/drain contact 192 extends down through the ILD layers 165 and 160 and the bottom spacer layer 130 to make contact to the bottom source/drain region 120. The vertical source/drain contact 194 extends down through the ILD layers 165 and 160 and the gate encapsulation liner layer 150 to make contact to the HKMG structure 140. The vertical source/drain contacts 190-1, 190-2, and 190-3 extend at least partially through the ILD layer 165 and have large footprints to make contact to each of the upper (top) epitaxial source/drain layers 180 that are formed on the upper portions of the vertical semiconductor fins 115. The vertical source/drain contacts 190-1, 190-2, and 190-3 are spaced apart along a length of the semiconductor fins 115 providing different electrical pathways for active current flow and sensing of electrical potential. The active drain contacts 196-1 and 196-2, and sensor drain contacts 198-1, 198-2, and 198-3 extend through the ILD layer 165 to their respective vertical source/drain contacts 190-1, 190-2, and 190-3. In this configuration, the vertical semiconductor fins 115 are connected in parallel, providing a multi-fin vertical FET device with a plurality of vertical channel structures (e.g., twelve vertical semiconductor fins 115) surrounded by the common HKMG structure 140 with the active and sensor drain contacts being connected to respective vertical source/drain contacts 190-1, 190-2, and 190-3.

FIGS. 1-8 schematically illustrate an exemplary semiconductor IC device 100 in which the vertical source/drain contacts 190-1, 190-2, and 190-3, active drain contacts 196-1 and 196-2, and sensor drain contacts 198-1, 198-2, and 198-3 are designed to achieve enhanced accuracy in the measurement of contact resistance of the vertical FET device including, for example, reducing crowding resistance in the measurement. With reference now to the conceptual diagrams shown in FIGS. 9 and 10, the effect of crowding resistance on the measurement of contact resistance in a vertical FET structure and the enhanced accuracy provided by semiconductor IC device 100 will now be described.

Figure 9:
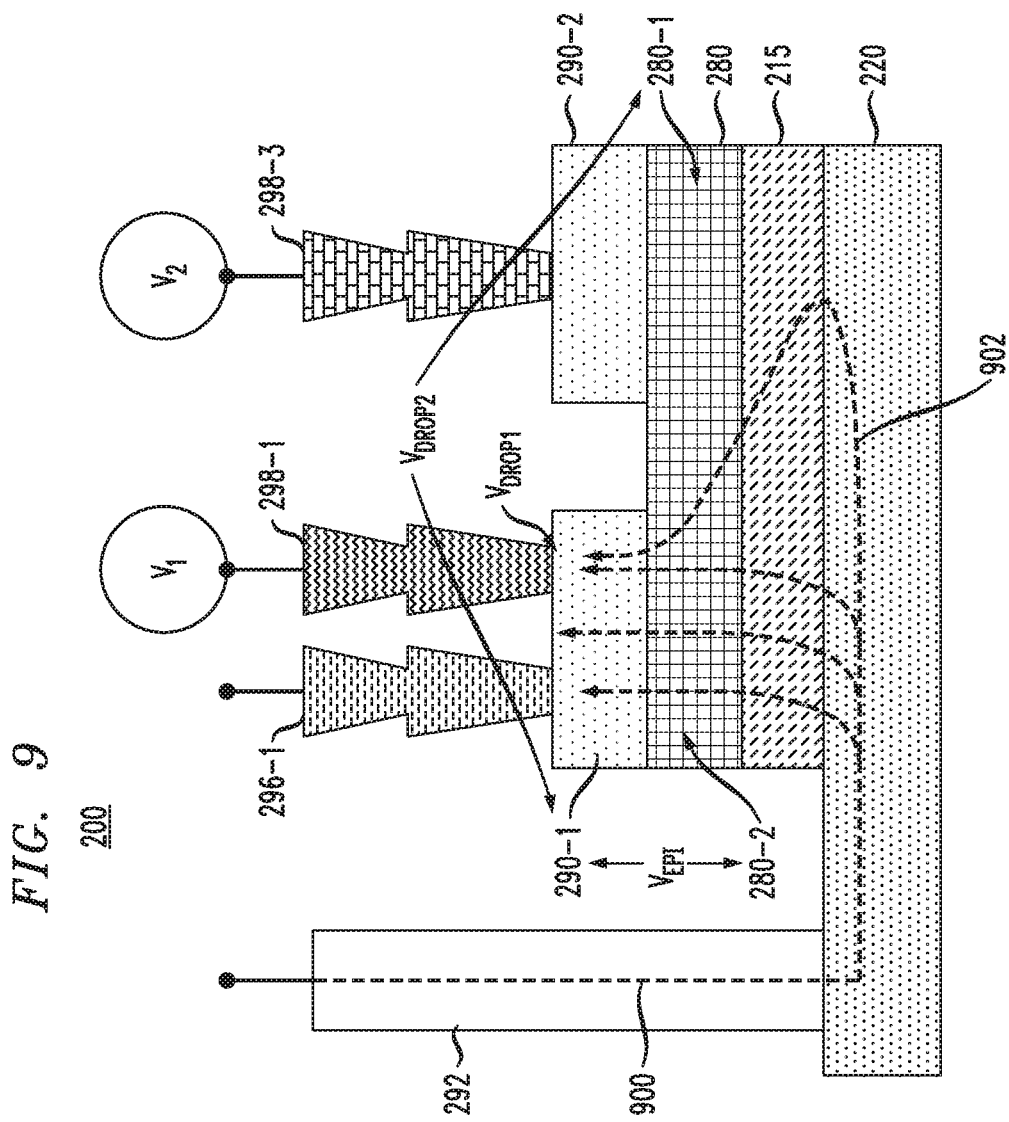
FIG. 9 is a conceptual diagram of the current flow in a semiconductor IC device, according to an embodiment of the present disclosure.

FIG. 9 is a conceptual diagram of an example semiconductor IC device 200 comprising a vertical FET device in which crowding resistance in the upper source/drain layer may substantially affect the measurement of contact resistance of a vertical source/drain contact associated with a particular active drain. It is important to note that the diagram of FIG. 9 is a conceptual representation of the flow of current in semiconductor IC device 200 and does not represent the actual structure or design of a semiconductor IC device. Semiconductor IC device 200 comprises many layers and components that are similar to those found in semiconductor IC device 100, not all of which are shown for the sake of clarity, and such layers and components will be described using similar reference numbers.

As seen in FIG. 9, for example, semiconductor IC device 200 comprises vertical semiconductor fins 215, a bottom source/drain region 220, an upper epitaxial source/drain layer 280, vertical source/drain contacts 290-1, 290-2, and 292, an active drain contact 296-1, and sensor drain contacts 298-1 and 298-3. In an example technique to measure the contact resistance of the vertical source/drain contact 290-1 which is connected to the active drain contact 296-1, voltmeters $V_1$ and $V_2$ (or other sensor devices) are connected to respective sensor drain contacts 298-1 and 298-3.

When electrical energy is applied to vertical source/drain contact 292, current flows between vertical source/drain contact 292 and active source drain contact 296-1. As can be seen by the dashed lines 900 in FIG. 9, the current flows through the bottom source/drain region 220, semiconductor fins 215, upper source/drain layers 280, vertical source/drain contact 290-1, and finally through active drain contact 296-1. While the current is flowing, an electrical potential is measured by voltmeter $V_1$ and by voltmeter $V_2$. Voltage of the energy output at active drain contact 296-1 may also be measured. As an example, the difference between the voltage of the energy output at active drain contact 296-1 and the electrical potential measured by voltmeter $V_1$ represents the voltage drop $V_{Drop1}$ at the interface between sensor drain contact 298-1 and vertical source/drain contact 290-1. The difference between the electrical potential measured by voltmeter $V_1$ and electrical potential measured by voltmeter $V_2$ represents the voltage drop $V_{Drop2}$ at the interface between vertical source/drain contact 290-1 and a first portion 280-1 of upper epitaxial source/drain layers 280, since no active drain contact is present on source/drain contact 290-2 to draw current.

In ideal circumstances, the voltage drop $V_{Drop2}$ is equal to or approximately equal to a voltage drop $V_{EPI}$ at the interface of the active vertical source/drain contact 290-1 and a second portion 280-2 of the upper epitaxial source/drain layer 280, and the voltage drop $V_{Drop2}$ may be used as a substitute for a direct measurement and determination of the voltage drop $V_{EPI}$ at the interface of active vertical source/drain contact 290-1 and the second portion 280-2 of the upper source/drain layer 280. However, in the configuration of semiconductor IC device 200 shown in FIG. 9, the voltage drop $V_{Drop2}$ determined based on the potential measured by voltmeter $V_2$ will be greater than the voltage drop $V_{EPI}$ associated with the interface of the active vertical source/drain contact 290-1 and the second portion 280-2 of the upper epitaxial source/drain layer 280 due to crowding resistance within the upper epitaxial source/drain layer 280. For example, as illustrated in FIG. 9, a portion of the current traveling between vertical source/drain contact 292 and active drain contact 296-1 also travels through the first portion 280-1 of the upper epitaxial source/drain contact 290-2, as denoted by dashed line 902. This stray current causes crowding resistance within the first portion 280-1 of the upper epitaxial source/drain layer 280 which increases the voltage drop $V_{Drop2}$ relative to the actual voltage drop $V_{EPI}$ occurring at the interface of the active vertical source/drain contact 290-1 and the second portion 280-2 of the upper epitaxial source/drain layer 280, potentially resulting in a loss of accuracy in the measurement of the contact resistance of vertical source/drain contact 290-1.

As an example, if the output voltage sensed at active drain contact 296-1 is 50 mv, sensor drain contact 298-1 may measure an electrical potential of 45 mv and sensor drain contact 298-3 may measure an electrical potential of 30 mv. The voltage drop $V_{Drop1}$ between the active drain contact 296-1 and sensor drain contact 298-1 is then 5 mv (50 mv-45 mv), which represents the voltage drop at the interface between sensor drain contact 298-1 and vertical source/drain contact 290-1. The resistance of the vertical source/drain contact 290-1 may be calculated by dividing the voltage drop $V_{Drop1}$ by the current of the supplied energy according to Ohm's law.

The voltage drop $V_{Drop2}$ between sensor drain contact 298-1 and sensor drain contact 298-3 is 15 mv (45 mv-30 mv), which represents the voltage drop at the interface between vertical source/drain contact 290-1 and the first portion 280-1 of the upper source/drain layer 280. Under ideal circumstances with little to no crowding resistance, the contact resistance of the active vertical source/drain contact 290-1 and the second portion 280-2 of the upper source/drain layer 280 may be calculated by dividing the voltage drop $V_{Drop2}$ by the current of the supplied energy according to Ohm's law. However, because the stray current, as denoted by dashed line 902, causes crowding resistance in the measurement by voltmeter $V_2$, the contact resistance calculated based on voltage drop $V_{Drop2}$ does not match the actual contact resistance of the active vertical source/drain contact 290-1 and the second portion 280-2 of the upper source/drain layer 280. For example, the actual voltage drop $V_{EPI}$ caused by the second portion 280-2 of the upper source/drain layer 280 may be 10 mv instead of the 15 mv voltage drop $V_{Drop2}$ determined based on the measurement by voltmeter $V_2$, a 5 mv difference. Accordingly, the contact resistance of the upper source/drain layer 280 calculated based on voltage drop $V_{Drop2}$ may be greater than the resistance due to the actual voltage drop $V_{EPI}$. This discrepancy affects the characterization of the resistance of the semiconductor IC device 200 which may negatively affect the function of the semiconductor IC device 200 or a system or apparatus using the semiconductor IC device 200 during operation.

Figure 10:
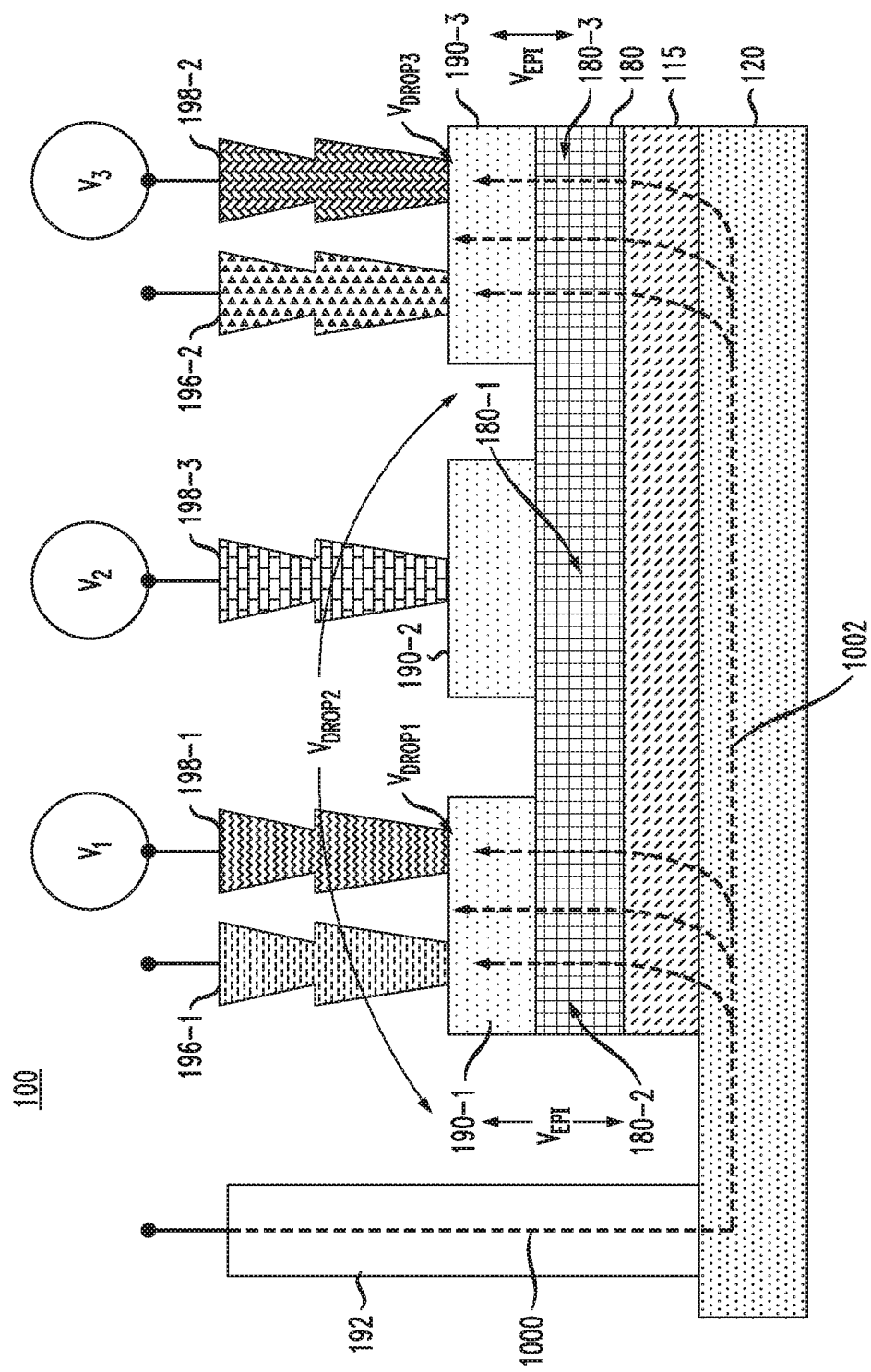
FIG. 10 is a conceptual diagram of the current flow in the semiconductor IC device of FIG. 1, according to an embodiment of the present disclosure.

With reference now to FIGS. 1-8 and 10, the crowding resistance described above with reference to FIG. 9 may be mitigated through the use of semiconductor IC device 100. It is important to note that the diagram of FIG. 10 is a conceptual representation of the flow of current in semiconductor IC device 100 and does not represent the actual structure or design of semiconductor IC device 100. As can be seen in FIGS. 1-4 and 10, an additional vertical source/drain contact 190-3 having an active drain contact 196-2 is formed on upper source/drain layer 180. In some embodiments, for example, as shown in FIGS. 1-4, and conceptually in FIG. 10, vertical source/drain contact 190-2 is formed between vertical source/drain contact 190-1 and vertical source/drain contact 190-3 with second ILD layer 165 formed therebetween (note that second ILD layer 165 is not shown in FIGS. 1 and 10 for clarity). As seen in FIG. 10, for example, when electrical energy is supplied to vertical source/drain contact 192, the current, depicted by the dashed lines 1000, flows to both active drain contact 196-1 via vertical source/drain contact 190-1 and active drain contact 196-2 via vertical source/drain contact 190-3.

The addition of the second active drain contact 196-2 inhibits stray current from flowing through a first portion 180-1 of the upper source/drain layer 180 beneath vertical source/drain contact 190-2 and back to active drain contact 196-1 (e.g., as described above with reference to dashed line 902 of FIG. 9) since the current will instead simply flow through a third portion 180-3 of the upper source/drain layer 180 beneath vertical source/drain contact 190-3 to active drain contact 196-2, as depicted, for example, by dashed lines 1002. For example, in semiconductor IC device 100, current will flow to the active drain contacts 196-1 and 196-2 via vertical source/drain contacts 190-1 and 190-3 on either side of vertical source/drain contact 190-2. The presence of vertical source/drain contact 190-3 and active drain contact 196-2 in addition to vertical source/drain contact 190-1 and active drain contact 196-1 mitigates the occurrence of crowding resistance in the first portion 180-1 of upper source/drain layer 180 beneath vertical source/drain contact 190-2 in semiconductor IC device 100 as compared to semiconductor IC device 200. Because the occurrence of crowding resistance is mitigated, the difference between the actual voltage drop $V_{EPI}$ at the interface of active vertical source/drain contact 190-1 and the second portion 180-2 of upper source/drain layer 180 (or at the interface of active vertical source/drain contact 190-3 and the third portion 180-3 of upper source/drain layer 180) and the voltage drop $V_{Drop2}$ at the interface between vertical source/drain contact 190-1 and the first portion 180-1 of the upper source/drain layer 180 directly underneath vertical source/drain contact 190-2 (or at the interface between 190-3 and 180-1) determined based on the electrical potential measured by voltmeter $V_2$ is significantly reduced as compared to the difference described above with respect to semiconductor IC device 200. Because the difference is significantly reduced, the voltage drop $V_{Drop2}$, as determined based on the electrical potential measured by voltmeter $V_2$, may be used to calculate a more accurate characterization of the contact resistance of the upper source/drain layer 180 and the top contact layers 190-1 and 190-3.

As an example, when energy is supplied to vertical source/drain contact 192, current flows to active drain contact 196-1 and also to active drain contact 196-2. An output voltage of is 50 mv may be sensed at either or both of active drain contact 196-1 and active drain contact 196-2. A voltmeter $V_1$ connected to sensor drain contact 198-1 may measure an electrical potential of 45 mv, in a similar manner to that described above with reference to FIG. 9. Likewise, a voltmeter $V_3$ connected to sensor drain contact 198-2 may also measure an electrical potential of 45 mv. While described as including a voltmeter measuring electrical potential at both sensor drain contacts 198-1 and 198-2, in some embodiments a voltmeter may only be connected one of sensor drain contacts 198-1 and 198-2. In this example, sensor drain contact 198-3 may measure an electrical potential of 34.75 mv.

The voltage drop $V_{Drop1}$ between the active drain contact 196-1 and sensor drain contact 198-1 is 5 mv (50 mv-45 mv), which represents the voltage drop at the interface between sensor drain contact 198-1 and vertical source/drain contact 190-1. Likewise, the voltage drop $V_{Drop3}$ between the active drain contact 196-2 and sensor drain contact 198-2 is also 5 mv (50 mv-45 mv), which represents the voltage drop at the interface between sensor drain contact 198-2 and vertical source/drain contact 190-3. The resistance of the vertical source/drain contacts 190-1 and 190-3 may be calculated by dividing their respective voltage drops $V_{Drop1}$ and $V_{Drop3}$ by the current of the supplied energy according to Ohm's law.

The voltage drop $V_{Drop2}$ between vertical source/drain contact 190-1 and sensor drain contact 198-3 is 10.25 mv (45 mv-34.75 mv), which represents the voltage drop at the interface between vertical source/drain contact 190-1 and the first portion 180-1 of the upper source/drain layer 180 directly underneath vertical source/drain contact 190-2 (or at the interface between 190-3 and 180-1). In this example, the resistance of the first portion 180-1 of the upper source/drain layer 180 calculated based on voltage drop $V_{Drop2}$ is much closer to the actual resistance of the upper source/drain layer 180. For example, the actual voltage drop $V_{EPI}$ caused by the second portion 180-2 or third portion 180-3 of the upper source/drain layer 180 is 10 mv, as described above. Since the voltage drop $V_{Drop2}$ in semiconductor IC device 100 is determined based on the measurement by voltmeter $V_2$ is 10.25 mv, only a 0.25 mv difference as compared to the 5 mv in the example for FIG. 9, the resistance of the upper source/drain layer 180 calculated based on voltage drop $V_{Drop2}$ is substantially more accurate relative to the resistance due to the actual voltage drop $V_{EPI}$ since the crowding resistance has been mitigated by the presence of the active drain contact 196-2 in addition to the active drain contact 196-1. Because of this, semiconductor IC device 100 provides significantly increased accuracy in measuring the resistance of the upper source/drain layer 180 and which allows for better characterization of contact resistance of the semiconductor IC device 100.

Figure 11:
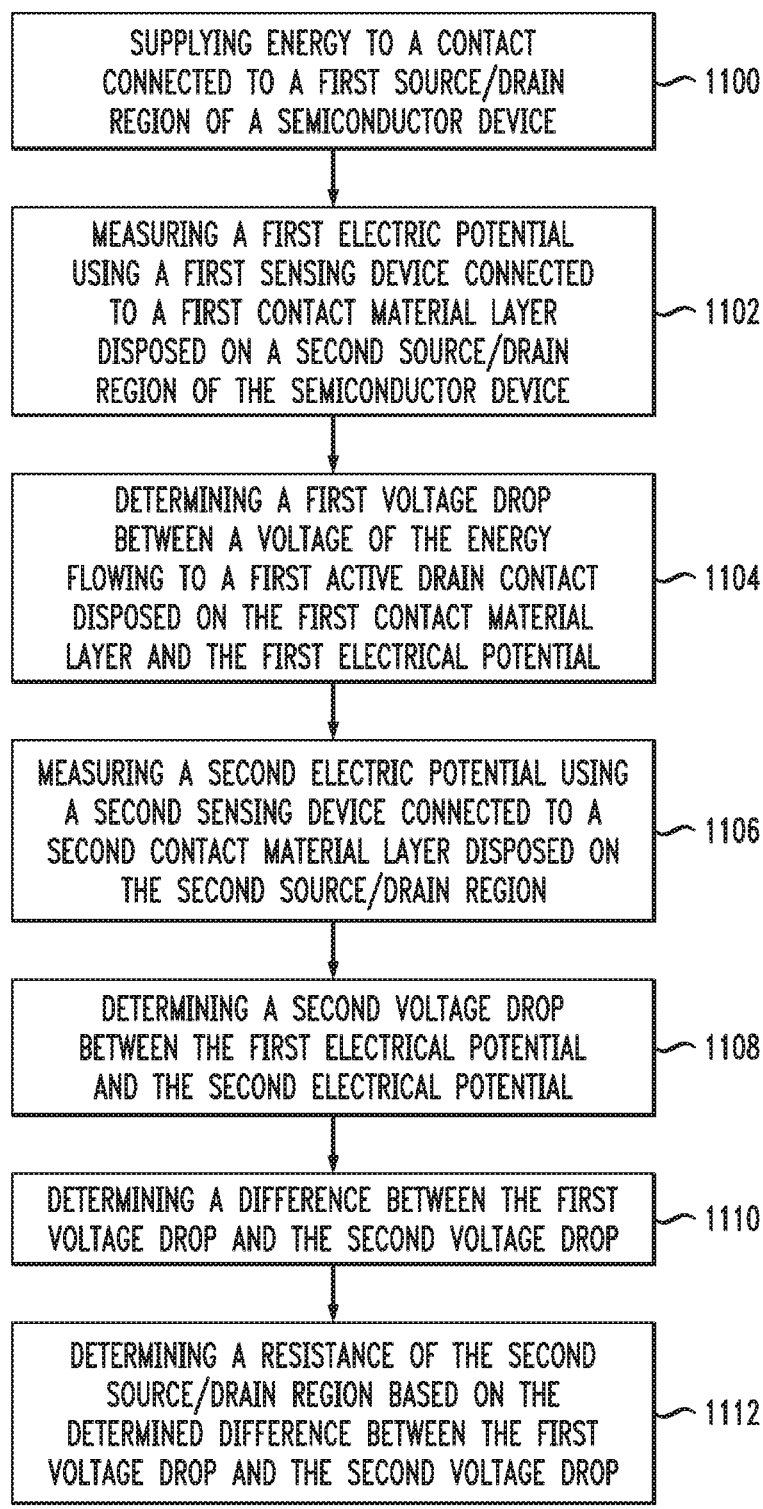
FIG. 11 is a flow diagram of techniques for measuring contact resistance in a semiconductor IC device, according to an embodiment of the present disclosure.

With reference now to FIG. 11, an example method of measuring contact resistance in a semiconductor device is disclosed.

At 1100, energy is supplied to a contact connected to a first source/drain region of the semiconductor device. For example, the energy is supplied to vertical source/drain contact 192. The energy flows through the semiconductor device to at least a first active drain contact, e.g., active drain contact 196-1, and a second active drain contact, e.g., active drain contact 196-2, of the semiconductor device.

At 1102, a first electrical potential associated with the supplied energy is measured using a first sensing device, e.g., voltmeter $V_1$ or voltmeter $V_3$, connected to one of a first contact material layer, e.g., vertical source/drain contact 190-1 via sensor drain contact 198-1, disposed on a second source/drain region, e.g., upper source/drain region 180, of the semiconductor device and a second contact material layer, e.g., vertical source/drain contact 190-3 via sensor drain contact 198-2, disposed on the second source/drain region. The first active drain contact, e.g., 196-1, is disposed on the first contact material layer, e.g., vertical source/drain contact 190-1, and the second active drain contact, e.g., 196-1, is disposed on the second contact material layer, e.g., vertical source/drain contact 190-3.

At 1104, a first voltage drop, e.g., $V_{Drop1}$, between a voltage of the energy flowing to the first active drain contact, e.g., 196-1, and the first electrical potential is determined, e.g., by subtracting the measured first electrical potential from the voltage of the energy at the first active drain contact.

At 1106, a second electrical potential associated with the supplied energy is measured using a second sensing device, e.g., voltmeter $V_2$, connected to a third contact material layer, e.g., vertical source/drain contact 190-2 via sensor drain contact 198-3, disposed on the second source/drain region.

At 1108, a second voltage drop between the first electrical potential and the second electrical potential is determined, e.g., by subtracting the measured second electrical potential from the measured first electrical potential.

At 1110, a difference between the first voltage drop and the second voltage drop is determined.

At 1112, a resistance of the second source/drain layer, e.g., source/drain region 180, is determined based on the determined difference between the first voltage drop and the second voltage drop.

Semiconductor IC device 100 may be fabricated using a variety of semiconductor fabrication techniques. For example, starting with semiconductor substrate 110, a plurality of vertical semiconductor fins 115 are formed on a surface of semiconductor substrate 110 using known methods and materials.

For example, while the semiconductor substrate 110 is illustrated as a generic substrate layer, the semiconductor substrate 110 may comprise various structures and layers of semiconductor material. In some embodiments, the semiconductor substrate 110 is a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In other embodiments, the semiconductor substrate 110 is an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure.

In some embodiments, the vertical semiconductor fins 115 are patterned from a crystalline Si or SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on a silicon substrate layer. A strained-Si/relaxed-SiGe structure provides a tensile strain which primarily improves electron mobility for n-type FET devices, while a strained-SiGe/relaxed-Si structure provides a compressive strain which primarily improves hole mobility for p-type FET devices.

The vertical semiconductor fins 115 can be fabricated using various methods. For example, for bulk and SOI substrate embodiments, the vertical semiconductor fins 115 can be formed by depositing a layer of hardmask material (e.g., silicon nitride layer) on the upper surface of the semiconductor substrate 110 and patterning the layer of hardmask material to form an etch mask comprising the hardmask layers which define an image of the pattern of vertical semiconductor fins 115 to be etched in the upper surface of the semiconductor substrate 110. The hardmask layers are used as an etch mask to etch the upper surface of the semiconductor substrate 110 using an anisotropic dry etch process to form a pattern of vertical semiconductor fins in different device regions across the semiconductor wafer, twelve of which are shown in FIGS. 1 and 5-8 for ease of illustration.

Next, dielectric sidewall spacers are formed to cover the sidewalls of the hardmask layers and the upper portions of the vertical semiconductor fins 115. In some embodiments, the dielectric spacers are formed of silicon nitride. The dielectric spacers are formed by a process which comprises depositing a conformal layer of dielectric material (e.g. silicon nitride). The conformal layer of dielectric material can be deposited using plasma-enhanced chemical vapor deposition (PECVD), atomic layer deposition (ALD), or other suitable deposition methods which enable the deposition of thin films of dielectric material with high conformality. The conformal layer of dielectric material is then patterned using a directional dry etch process (e.g., RIE) to remove the portions of the conformal layer of dielectric material on the horizontal surfaces, while leaving the portion of the conformal dielectric material on the vertical surfaces.

Next, an epitaxial source/drain layer is grown which forms, in part, the lower source/drain region 120 of the vertical FET device (FIGS. 1-8). The epitaxial source/drain region 120 is formed by epitaxially growing semiconductor material (e.g., epitaxial silicon (Si) material, silicon-germanium (SiGe) material, carbon doped silicon (Si:C) material, phosphorus doped silicon (Si:P) material, phosphorus doped SiGe (SiGe:P) material, boron doped SiGe (SiGe:B) material, etc.) starting on the exposed surfaces of the substrate 110 and the exposed sidewall surfaces of the bottom portions of the vertical semiconductor fins 115 using known techniques such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques. The type of epitaxial material and doping used to form the doped epitaxial source/drain region 120 will vary depending on whether the vertical FET device is a P-type or N-type FET device. The dielectric sidewall spacers prevent the formation of epitaxial material on the upper portions of the vertical semiconductor fins 115 during the epitaxy process.

In addition, the epitaxial source/drain region 120 is doped using known techniques. For example, in one embodiment, the epitaxial source/drain region 120 is "in-situ" doped during epitaxial growth by adding a dopant gas to the source deposition gas. Exemplary dopant gases may include a boron (B) containing gas such as $BH_3$ for P-type FET devices or a phosphorus (P) or arsenic (As) containing gas such as $PH_3$ or $AsH_3$ for N-type FET devices, wherein the concentration of impurity in the gas phase determines its concentration in the epitaxially grown semiconductor material. The use of an in-situ doping process is merely an example. For instance, an ex-situ process may be used to introduce dopants into the source/drain regions. Other doping techniques can be used to incorporate dopants in the source/drain regions. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Following the formation of the doped epitaxial source/drain region 120, an STI layer (not shown) is formed using known materials and fabrication techniques. For example, a block mask is formed to cover the vertical semiconductor fins 115 and the area of the deposited epitaxial source/drain region 120. One or more anisotropic dry etch processes (e.g., RIE) are then performed to etch away the exposed portions of the epitaxial material and etch trenches into the semiconductor substrate to a target depth below the bottom level of the epitaxial source/drain region 120. The trenches are then filled with insulating/dielectric material to form the STI layer. The insulating/dielectric material may include, for example, a conformal SiN liner that is deposited initially to line the sidewalls and bottom surface of the trenches, followed by a blanket deposition of an oxide material (e.g., $SiO_2$ or silicon oxynitride (SiON)) to fill the trenches. The overburden (excess) insulating/dielectric material is then removed by planarizing (via chemical-mechanical planarization (CMP)) the overburden material down to the top of the hardmask layers, and then further recessed down to a target level using an etch-back process (e.g., selective RIE process) to form the STI layer.

Next, bottom spacer layer 130 is formed by depositing an oxide material using a high density plasma (HDP) chemical vapor deposition (CVD) process (HDPCVD), wherein the oxide material comprises a low-k insulating oxide material such as silicon dioxide, silicon oxynitride, etc. In other embodiments, the bottom spacer layer 130 can be formed of HDP silicon nitride, or other suitable materials. In one embodiment, the parameters of the HDP deposition are tuned to achieve a directional deposition of oxide or nitride material wherein the deposition rate of the oxide or nitride material on horizontal surfaces is greater than the deposition rate of oxide or nitride material on vertical surfaces. An etch back process is performed to remove oxide or nitride material on the vertical surfaces. By way of example only, a HDPCVD or physical vapor deposition (PVD) process can be used for directional film deposition, and an oxide-selective or nitride-selective (depending on the spacer material) isotropic etch can be used to remove the (thinner) spacer material that is deposited on the vertical surfaces.

The next stage of the fabrication process comprises forming the HKMG structure 140 for the vertical FET device. The dielectric sidewall spacers are removed using any suitable etch process and etch chemistry that is configured to etch the dielectric material of the sidewall spacers selective to the materials that form the vertical semiconductor fins 115 and the bottom spacer layer 130.

The high-k gate dielectric layer 142 is formed by depositing one or more conformal layers of high-k gate dielectric material to conformally cover the surface topography of the semiconductor device. The conformal layer(s) of high-k dielectric material can be formed of any suitable dielectric having a dielectric constant (k) of about 3.9 or greater. For example, the gate dielectric material can include, but is not limited to, metal oxides such as hafnium oxide, hafnium silicon oxide, hafnium silicon oxynitride, hafnium zirconium oxide, and nitrided films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal gate dielectric layer is formed with a thickness in a range of about 0.5 nm to about 2.0 nm, which will vary depending on the target application. The conformal high-k gate dielectric layer 142 is deposited using known methods such as ALD, for example, which allows for high conformality of the gate dielectric material.

In some embodiments, the metal gate layer 144 is formed by depositing one or more conformal work function metal (WFM) layers over the conformal high-k gate dielectric layer 142. In one embodiment, a total thickness of the conformal WFM material is in a range of 2 nm to about 5 nm. The WFM layers are used to obtain target work functions which are suitable for the type (e.g., N-type or O-type) of vertical FET device to be formed and, thus, allow for tuning of the threshold voltage of the vertical FET device. For example, the WFM layers can include titanium nitride (TiN), and an aluminum (Al) containing alloy material such as titanium aluminum carbide (TiAlC), TiAl, AlC, etc. In other embodiments, the WFM layer may include, e.g., TaN, Zr, W, Hf, Ti, Al, Ru, Pa, ZrAl, WAl, TaAl, HfAl, TiAlC, TaC, TiC, TaMgC, or other types, compositions, or alloys of work function metals that are commonly used to obtain target work functions for threshold voltage tuning. The WFM layers are deposited using known methods such as ALD or molecular layer deposition (MLD), for example, which allows for high conformality of the gate dielectric material.

Furthermore, in some embodiments, the metal gate layer 144 includes a conformal layer of lower-resistance metallic material that is formed over the WFM layers to reduce a total effective resistance of the metal gate layer 144. For example, the low-resistance metallic material can be tungsten, titanium, tantalum, cobalt, ruthenium, zirconium, copper, aluminum, platinum, tin, silver, etc. The metal gate layer 144 may further comprise dopants that are incorporated during or after deposition. The layer of conductive material is deposited using a suitable deposition process, for example, CVD, PECVD, PVD, plating, thermal or e-beam evaporation, sputtering, etc.

The gate encapsulation liner layer 150 is conformally deposited over the metal layer gate layer 144 to protect and electrically insulate the HKMG structure 140 of the vertical FET device from surrounding elements. For example, the gate encapsulation liner layer 150 serves as a diffusion barrier between the metal gate layer 144 and a surrounding ILD layer that is formed in a subsequent stage of fabrication. In some embodiments, the gate encapsulating liner layer 150 is formed of silicon nitride. In other embodiments, the gate encapsulation liner layer 150 is formed of SiBCN, SiCON, or any other type of low-k dielectric material that is commonly used to form insulating gate sidewall spacers of FET devices. The gate encapsulation liner layer 150 is formed using known deposition techniques such as ALD, CVD, PVD, etc., which are tuned to achieve high conformality of the gate encapsulation liner layer 150.

Next, the ILD layer 160 is formed by depositing a layer of dielectric material and performing a CMP process to remove the overburden dielectric material and planarize the ILD layer 160 down to the gate encapsulating liner layer 150. The ILD layer 160 may comprise any suitable insulating/dielectric material that is commonly utilized to form front-end-of-line ILD layers including, but not limited to, silicon oxide, silicon nitride, silicon oxynitride, carbon-doped silicon glass (SiCOH) or organosilicate glass (SOG)), a fluorinated silicon glass (FSG), or other types of silicon-based low-k dielectrics (e.g., k less than about 4.0), porous dielectrics, known ULK (ultra-low-k) dielectric materials (with k less than about 2.5), or any suitable combination of those materials. The ILD layer 160 is deposited using known deposition techniques, such as, for example, ALD, CVD, PECVD, PVD, or spin-on deposition.

Prior to forming the ILD layer 160, a gate cut process can be performed to pattern the gate dielectric layer 142 and metal gate layer 144 to define the HKMG structure 140 of the vertical FET device. For example, a gate cut process comprises forming a block mask to cover the portions of the gate dielectric layer 142 and the metal gate layer 144 which define the footprint of the HKMG structure 140, and then utilizing the block mask to anisotropically etch away exposed portions of the gate dielectric layer 142 and the metal gate layer 144 outside the field region of the vertical FET device down to the bottom spacer layer 130. In one embodiment, the block mask is formed by depositing a layer of mask material (e.g., photoresist material, or organic planarizing layer (OPL) material), and patterning the layer of mask material to form a block mask with an image that defines the footprint of the HKMG structure 140 of the vertical FET device. The gate cut process is performed, for example, using a RIE process to etch down the exposed portions of the gate dielectric layer 142 and the metal gate layer 144.

Following the formation of the ILD layer 160, any known sequence of processing steps can be performed to continue the fabrication of the semiconductor IC circuit device 100 shown in FIGS. 1-8. Briefly, the exposed upper portions of the gate encapsulation liner layer 150 are removed to expose the metal gate layer 144. A gate recess process is performed to recess the upper surfaces of the metal gate layer 144 and the gate dielectric layer 142 down to a target level which defines a gate length $L_G$ (see FIGS. 6-8) of the vertical FET device. The gate recess process is performed using, for example, an RIE process having an etch chemistry which is suitable to etch the conductive and insulating materials of the layers 142 and 144 selective to the nitride materials of the gate encapsulation liner layer 150 and the hardmask layers mentioned above.

The top spacers 170 are formed by depositing a layer of insulating material such as silicon oxide, silicon nitride, or some other type of low-k dielectric material that is commonly used to form insulating top spacers for vertical FET devices. The top spacers 170 can be fabricated using deposition and patterning methods well known to those of ordinary skill in the art, details of which are not necessary for understanding the exemplary embodiments discussed herein.

An etch process is performed to vertically etch down the exposed portions of the gate encapsulation liner layer 150 and the hardmask layers to expose the upper surfaces of the vertical semiconductor fins 115 on which the upper source/drain layers 180 are epitaxially grown. The gate encapsulation liner layer 150 and the hardmask layers can be removed using any suitable dry or wet etch process with an etch chemistry that is configured to etch the materials of the liner layer 150 and hardmask layer selective to the materials of the first ILD layer 160, the top spacers 170, and the vertical semiconductor fins 115.

Following removal of the hardmask layers, the upper source/drain layers 180 are epitaxially grown on the exposed upper portions of the vertical semiconductor fins 115. In one embodiment, the upper source/drain layers 180 are formed by epitaxially growing doped semiconductor layers (e.g., doped Si, doped SiGe, etc.) on the exposed upper portions of the vertical semiconductor fins 115 using known selective growth techniques in which the epitaxial material is not grown on the exposed surface of the first ILD layer 160 and the top spacers 170. The type of epitaxial semiconductor material that is used to form the upper source/drain layers 180 will vary depending on various factors including, but are not limited to, the type of material of the vertical semiconductor fins 115 and the device type (e.g., P-type or N-type) of the vertical FET device to be formed. In some embodiments, the upper source/drain layers 180 are doped in-situ or ex-situ, using the same or similar dopants and doping techniques as discussed above for doping the lower epitaxial source/drain region 120. Following the formation of the upper source/drain layers 180, a thermal anneal process may be performed to drive dopants into the upper surface of the vertical semiconductor fins 115.

Following the formation of upper source/drain layers 180, a MOL (middle of the line) process is performed to form the second ILD layer 165, form contact openings (e.g. trenches) in the ILD layers 165 and 160, and fill the contact openings with conductive material to form the vertical source/drain contacts 190-1, 190-2, 190-3, and 192, the vertical gate contact 194, active drain contacts 196-1 and 196-2, and sensor drain contacts 198-1, 198-2, and 198-3. A portion of the second ILD layer 165 is formed by depositing and planarizing a layer of insulating material which is the same or similar to the insulating material used to form the first ILD layer 160. The contact openings for the vertical source/drain and gate contacts are etched in the ILD layers 165 and 160 using any suitable lithographic patterning and dry etching methods, which are well known to those of ordinary skill in the art. The vertical contacts 190-1, 190-2, 190-3, 192, and 194 are formed using known materials and known fabrication methods. For example, a thin liner layer (e.g., diffusion barrier layer and/or seed layer) is initially deposited to line the contact openings, followed by the deposition of a metallic material such as tungsten, cobalt, ruthenium, copper, etc., to fill the contact openings with metallic material and form the vertical contacts 190-1, 190-2, 190-3, 192, and 194.

After forming vertical contacts 190-1, 190-2, 190-3, 192, and 194, an additional layer of insulating material which is the same or similar to the insulating material used to form the first ILD layer 160 is deposited and planarized to form an additional portion of the second ILD layer 165. The contact openings for the active drain contacts 196-1 and 196-2, and sensor drain contacts 198-1, 198-2, and 198-3 are etched in the additional portion of second ILD layer 165 using any suitable lithographic patterning and dry etching methods, which are well known to those of ordinary skill in the art. The active drain contacts 196-1 and 196-2, and sensor drain contacts 198-1, 198-2, and 198-3 are formed on the vertical contacts 190-1, 190-2, and 190-3 using known materials and known fabrication methods. For example, a thin liner layer (e.g., diffusion barrier layer and/or seed layer) is initially deposited to line the contact openings, followed by the deposition of a metallic material such as tungsten, cobalt, ruthenium, copper, etc., to fill the contact openings with metallic material and form the active drain contacts 196-1 and 196-2, and sensor drain contacts 198-1, 198-2, and 198-3 are formed on the vertical contacts 190-1, 190-2, and 190-3.

Following formation of the vertical contacts 190-1, 190-2, 190-3, 192, and 194, active drain contacts 196-1 and 196-2, and sensor drain contacts 198-1, 198-2, and 198-3, a BEOL (back end of line) process is performed to construct an BEOL interconnect structure to provide connections to/between the active drain contacts 196-1 and 196-2, and sensor drain contacts 198-1, 198-2, and 198-3 and other active or passive devices that are formed as part of the front-end-of-line (FEOL) layer.

Figure 12:
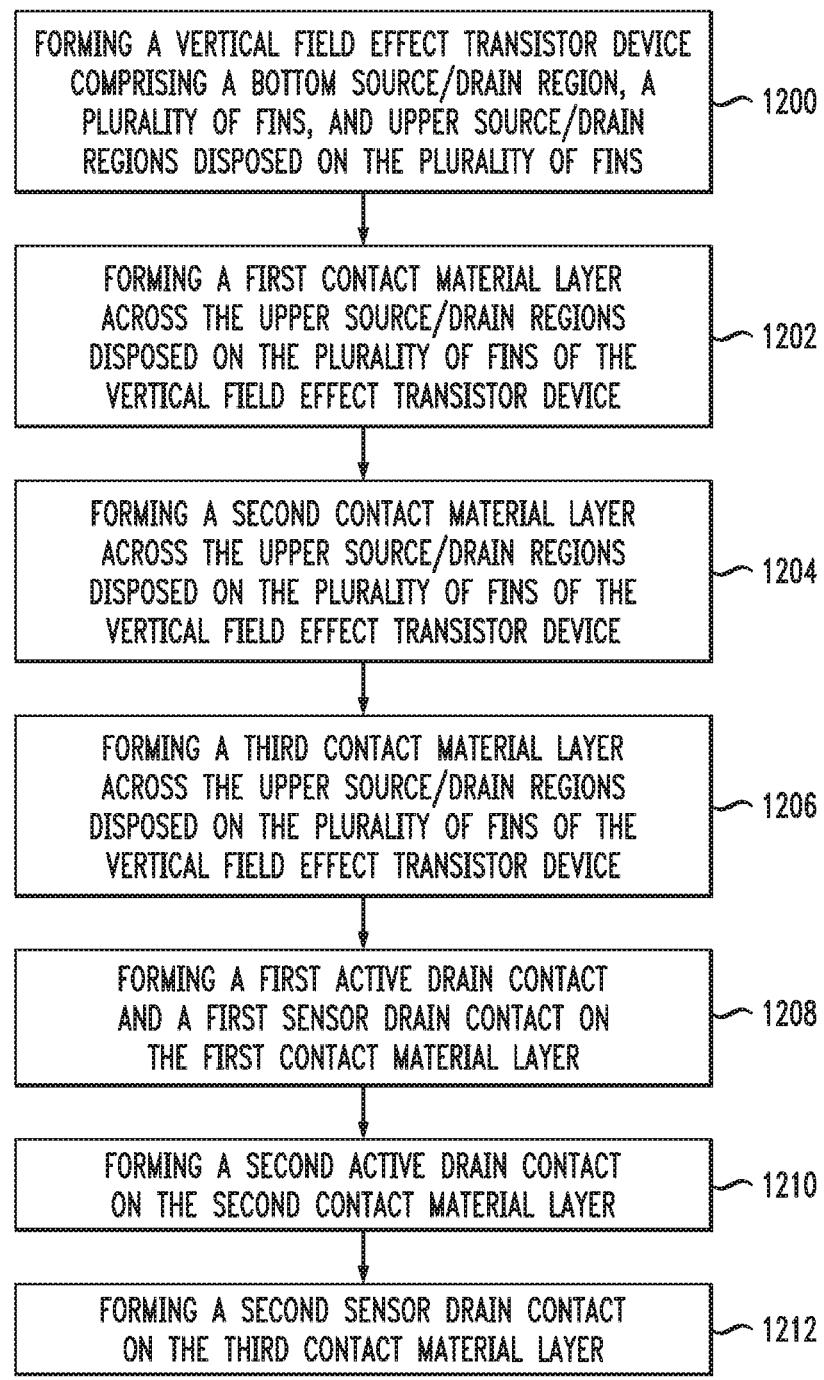
FIG. 12 is a flow diagram of techniques for fabricating a semiconductor IC device, according to an embodiment of the present disclosure.

With reference now to FIG. 12, an example method of fabricating a semiconductor device is disclosed.

At 1200, a vertical field effect transistor device comprising a bottom source/drain region 120, a plurality of fins 115, and upper source/drain regions 180 disposed on the plurality of fins 115 is formed, for example, in the manner described above.

At 1202, a first contact material layer, e.g., 190-1, is formed across the upper source/drain regions 180 disposed on the plurality of fins 115 of the vertical field effect transistor device, for example, in the manner described above.

At 1204, a second contact material layer, e.g., 190-3, is formed across the upper source/drain regions 180 disposed on the plurality of fins 115 of the vertical field effect transistor device, for example, in the manner described above.

At 1206, a third contact material layer, e.g., 190-2, is formed across the upper source/drain regions 180 disposed on the plurality of fins 115 of the vertical field effect transistor device, for example, in the manner described above.

At 1208, a first active drain contact, e.g., 196-1, and a first sensor drain contact, e.g., 198-1, are formed on the first contact material layer, e.g., 190-1, for example, in the manner described above.

At 1210, a second active drain contact, e.g., 196-2, is formed on the second contact material layer, e.g., 190-3, for example, in the manner described above.

At 1212, a second sensor drain contact, e.g., 198-3, is formed on the third contact material layer, e.g., 190-2, for example, in the manner described above.

It is to be understood that the methods discussed herein for fabricating vertical FET devices can be readily incorporated within semiconductor processing flows, semiconductor IC devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
a first source/drain region;
a contact disposed on the first source/drain region and configured to supply energy to the semiconductor device;
at least one fin extending between the first source/drain region and a second source/drain region of the semiconductor device;
a first contact material layer disposed on the second source/drain region;
a first active drain contact disposed on the first contact material layer;
a first sensor drain contact disposed on the first contact material layer;
a second contact material layer disposed on the second source/drain region;
a second active drain contact disposed on the second contact material layer;
a third contact material layer disposed on the second source/drain region; and
a second sensor drain contact disposed on the third contact material layer.

2. The semiconductor device of claim 1, wherein the first contact material layer is different than the second contact material layer.

3. The semiconductor device of claim 1, wherein the third contact material layer is different than the first contact material layer and the second contact material layer.

4. The semiconductor device of claim 1, wherein the third contact material layer is disposed between the first contact material layer and the second contact material layer along a longitudinal length of the second source/drain region.

5. The semiconductor device of claim 1, wherein the at least one fin comprises a plurality of fins, each fin having a respective second source/drain region disposed thereon, wherein the first contact material layer, second contact material layer and third contact material layer each extend across the second source/drain regions disposed on the plurality of fins.

6. The semiconductor device of claim 5, wherein the first drain contact is disposed at a first end portion of the first contact material layer proximate to a first of the fins, and wherein the second drain contact is disposed at a first end portion of the second contact material layer proximate to the first of the fins.

7. The semiconductor device of claim 6, wherein a first sensor contact is disposed at a second end portion of the first contact material layer proximate to a second of the fins, and wherein a second sensor contact is disposed at a second end portion of the second contact material layer proximate to the second of the fins.

8. The semiconductor device of claim 6, wherein the sensor drain contact is disposed on the third contact material layer proximate a third of the fins located between the first of the fins and the second of the fins and spaced from first and second end portions of the third contact material layer.

9. The semiconductor device of claim 5, wherein the first drain contact comprises a plurality of contacts each disposed on the first contact material layer proximate to a corresponding one of the plurality of fins, and wherein the second drain contact comprises a plurality of contacts each disposed on the second contact material layer proximate to a corresponding one of the plurality of fins.

10. The semiconductor device of claim 5, wherein the first drain contact, second drain contact, and sensor drain contact are disposed on their respective first, second and third contact material layers proximate the same fin of the plurality of fins.

11. A method for fabricating a semiconductor device, comprising:
   forming a vertical field effect transistor device comprising a bottom source/drain region, a plurality of fins, and upper source/drain regions disposed on the plurality of fins;
   forming a first contact material layer across the upper source/drain regions disposed on the plurality of fins of the vertical field effect transistor device;
   forming a second contact material layer across the upper source/drain regions disposed on the plurality of fins of the vertical field effect transistor device;
   forming a third contact material layer across the upper source/drain regions disposed on the plurality of fins of the vertical field effect transistor device
   forming a first active drain contact and a first sensor drain contact on the first contact material layer;
   forming a second active drain contact on the second contact material layer; and
   forming a second sensor drain contact on the third contact material layer.

12. The method of claim 11, wherein the first, second, and third contact material layers are spaced apart along a longitudinal direction of the plurality of fins.

13. The method of claim 11, wherein the first active drain contact and the first sensor drain contact are formed at opposite end portions of the first contact material layer.

14. The method of claim 11, wherein the second sensor drain contact is formed spaced apart from end portions of the third contact material layer.

* * * * *